(12) United States Patent
Lin

(10) Patent No.: US 12,183,864 B2
(45) Date of Patent: Dec. 31, 2024

(54) ELECTRONIC DEVICE

(71) Applicant: InnoLux Corporation, Miao-Li County (TW)

(72) Inventor: Chun-Hsien Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 614 days.

(21) Appl. No.: 17/534,473

(22) Filed: Nov. 24, 2021

(65) Prior Publication Data

US 2022/0209083 A1 Jun. 30, 2022

Related U.S. Application Data

(60) Provisional application No. 63/130,415, filed on Dec. 24, 2020.

(30) Foreign Application Priority Data

Sep. 10, 2021 (CN) .......................... 202111062712.2

(51) Int. Cl.
*H01L 33/62* (2010.01)
*G09G 3/00* (2006.01)
*H01L 25/075* (2006.01)
*H01L 27/15* (2006.01)

(52) U.S. Cl.
CPC ............. *H01L 33/62* (2013.01); *G09G 3/006* (2013.01); *H01L 25/0753* (2013.01); *H01L 27/156* (2013.01)

(58) Field of Classification Search
CPC ... H01L 33/62; H01L 25/0753; H01L 27/156; G09G 3/006; G09G 3/20; G09G 2300/026; G09G 2300/0426; G09G 2330/12; G02F 1/1309; G02F 1/13454; G02F 2203/69; H10K 59/121
See application file for complete search history.

(56) References Cited

U.S. PATENT DOCUMENTS

| | | | |
|---|---|---|---|
| 2014/0179032 A1* | 6/2014 | Hasebe | H01L 23/5226 438/15 |
| 2018/0204895 A1* | 7/2018 | Lin | H10K 59/131 |
| 2019/0051228 A1 | 2/2019 | Ma | |
| 2019/0180683 A1 | 6/2019 | Lee | |
| 2021/0201719 A1* | 7/2021 | Lee | H10K 59/40 |

FOREIGN PATENT DOCUMENTS

| | | |
|---|---|---|
| CN | 107221291 B | 4/2019 |
| CN | 110211973 A | 9/2019 |

* cited by examiner

*Primary Examiner* — Michael E Teitelbaum
(74) *Attorney, Agent, or Firm* — Winston Hsu

(57) ABSTRACT

An electronic device including a substrate, an electronic unit, a data line, a control unit, a test pad and a test switch element is provided by the present disclosure. The substrate includes a first surface and a second surface opposite to the first surface, wherein the first surface includes an active area. The electronic unit is disposed on the substrate and located in the active area. The data line is disposed on the substrate. The control unit is disposed on the substrate and located in the active area, and the control unit is electrically connected between the electronic unit and the data line. The test pad is disposed on the second surface of the substrate. The test switch element is disposed on the substrate and located in the active area, and the test switch element is electrically connected between the data line and the test pad.

20 Claims, 10 Drawing Sheets

ELECTRONIC DEVICE

CROSS REFERENCE TO RELATED APPLICATION

This patent application claims the benefit of U.S. provisional application No. 63/130,415, filed Dec. 24, 2020, and the entire contents of which are incorporated herein by reference.

BACKGROUND OF THE DISCLOSURE

1. Field of the Disclosure

The present disclosure relates to an electronic device, and more particularly to an electronic device having a test switch element.

2. Description of the Prior Art

In the manufacturing process of light emitting devices, a test element is usually used to test whether the light emitting elements (such as light emitting diodes) on the light emitting device is damaged, so as to replace the unavailable light emitting elements. In traditional light emitting devices, the test element is disposed in the peripheral area or non-display area of the light emitting device. However, the test element disposed in the non-display area of the light emitting device will cause the decrease of the screen-to-body ratio of the device, thereby affecting the display effect of the light emitting device. Therefore, to improve the configuration of the test element of the light emitting device is still an important issue in the present field.

SUMMARY OF THE DISCLOSURE

In some embodiments, an electronic device is provided by the present disclosure. The electronic device includes a substrate, an electronic unit, a data line, a control unit, a test pad and a test switch element. The substrate includes a first surface and a second surface opposite to the first surface, wherein the first surface includes an active area. The electronic unit is disposed on the substrate and located in the active area. The data line is disposed on the substrate. The control unit is disposed on the substrate and located in the active area, and the control unit is electrically connected between the electronic unit and the data line. The test pad is disposed on the second surface of the substrate. The test switch element is disposed on the substrate and located in the active area, and the test switch element is electrically connected between the data line and the test pad.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection.

The terms "approximately", "equal to", "equal" or "same", "substantially" or "approximately" are generally interpreted as being within ±20% of the given value, or interpreted as being within ±10%, ±5%, ±3%, ±2%, ±1%, or ±0.5% of the given value.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
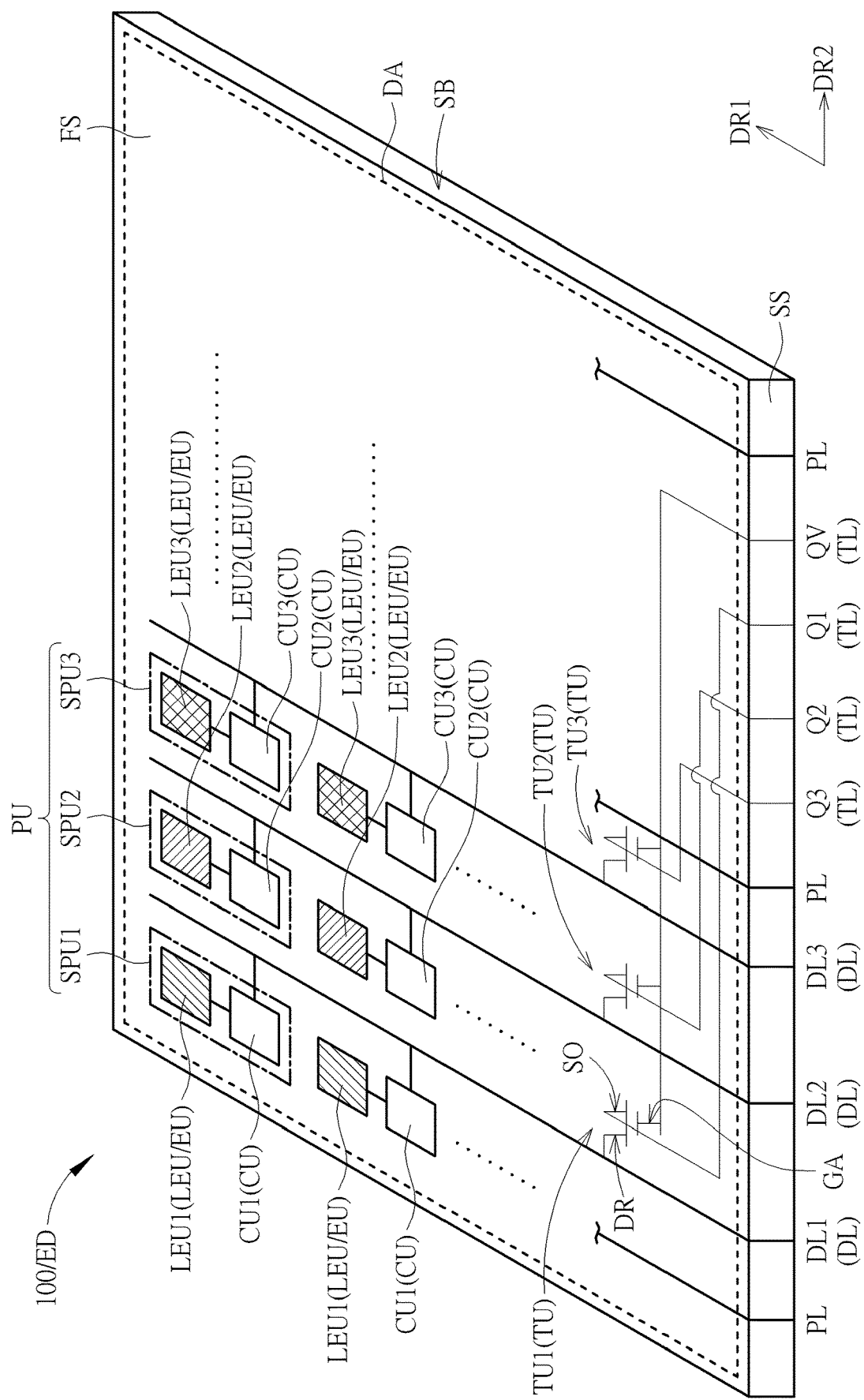
FIG. 1 schematically illustrates a top view of an electronic device according to a first embodiment of the present disclosure.
Figure 2:
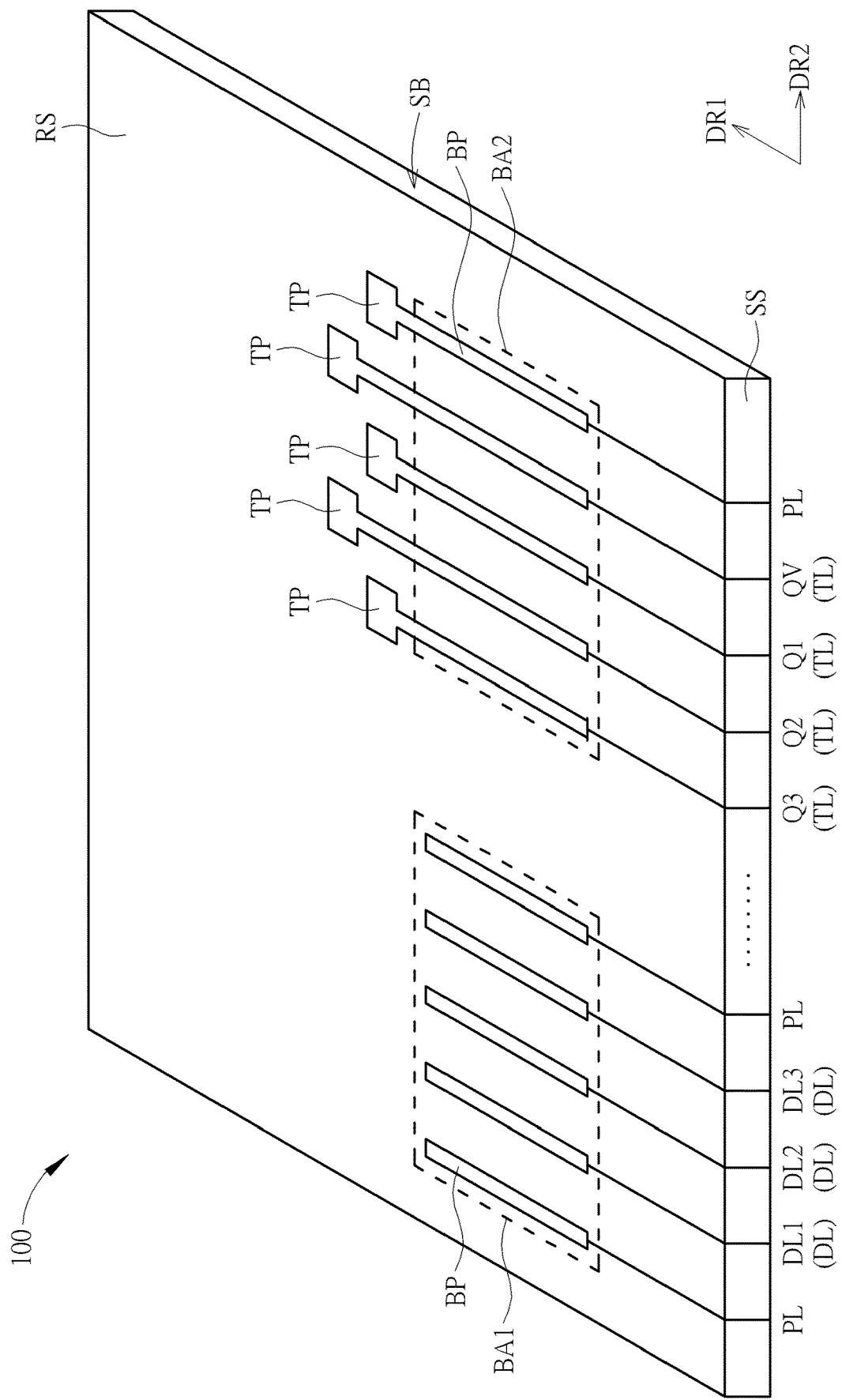
FIG. 2 schematically illustrates a bottom view of the electronic device according to the first embodiment of the present disclosure.

Referring to FIG. 1 and FIG. 2, FIG. 1 schematically illustrates a top view of an electronic device according to a first embodiment of the present disclosure, and FIG. 2 schematically illustrates a bottom view of the electronic device according to the first embodiment of the present disclosure. According to the present disclosure, the electronic device ED shown in FIG. 1 and FIG. 2 may for example include a light emitting device 100 that can display static or dynamic images or screens according to the demands and operations of users in the present embodiment, but not limited thereto. The electronic device ED of the present disclosure may for example be applied to laptops, common displays, tiled displays, vehicle displays, touch displays, television, surveillance cameras, smart phones, tablets, light source modules, light emitting devices or electronic devices of the above-mentioned products, but not limited thereto. According to some embodiments, the electronic device ED may be a light emitting device, a display device, a sensing device, a tiled device or an antenna device, but not limited thereto.

According to the present embodiment, as shown in FIG. 1 and FIG. 2, the electronic device ED may include a substrate SB, electronic units EU, control units CU, data lines DL, test pads TP and test switch elements TU, but not limited thereto. The substrate SB may include a first surface FS and a second surface RS, wherein the first surface FS of the substrate SB may include an active area DA, and the second surface RS may be another surface of the substrate SB opposite to the first surface FS. The electronic units EU may be disposed on the first surface FS of the substrate SB and located in the active area DA. The data lines DL may be disposed on the first surface FS of the substrate SB. The control units CU may be disposed on the first surface FS of the substrate SB and located in the active area DA of the substrate SB.

As shown in FIG. 1, the control unit CU may be electrically connected between the electronic unit EU and the data line DL. That is, the electronic unit EU may be electrically connected to the data line DL through the control unit CU. The test pads TP may be disposed on the second surface RS of the substrate SB. According to the present embodiment, the test switch elements TU of the electronic device ED may be disposed on the first surface FS of the substrate SB and located in the active area DA. In addition, as shown in FIG. 1, the test switch element TU may be electrically connected between the data line DL and the test pad TP. That is, the electronic unit EU may be electrically connected to the test pad TP through the data line DL and the test switch element TU. The elements and/or layers included in the electronic device ED will be detailed in the following. It should be noted that the elements and/or wires included in the electronic device ED of the present embodiment are not limited to the above-mentioned contents, and may also include any suitable elements and/or wires according to the demands of the design of the electronic device ED.

As shown in FIG. 1, the electronic device ED of the present embodiment may for example be a light emitting device 100, and the electronic units EU may for example be light emitting units LEU, but not limited thereto. For the convenience of description, the light emitting device 100 is taken as an example of the electronic device ED, and the light emitting unit LEU is taken as an example of the electronic unit EU in the following contents and figures, but the present disclosure is not limited thereto. According to the present embodiment, the electronic units EU may be disposed on the first surface FS of the substrate SB and located in the active area DA. In the condition that the electronic units EU are the light emitting units LEU, the active area DA may for example be a display area (which is also marked by DA), wherein the display area may be the light emitting area or the area for displaying images of the light emitting device 100. That is, plural light emitting units LEU may be disposed in the display area for displaying images. In some embodiments, as shown in FIG. 1, the area enclosed by the connection line of the outermost light emitting units LEU among the light emitting units LEU may be defined as the active area DA. In some embodiments, all of the light emitting units LEU on the substrate can be lighted up, and the area enclosed by the connection line of the outermost light emitting area may be defined as the active area DA. In some embodiments, the area enclosed by the connection line of the outermost control units CU may be defined as the active area DA. The shape of the active area DA shown in FIG. 1 is just exemplary, and the present disclosure is not limited thereto. In some embodiments, the active area DA may include any suitable shape.

In some embodiments, the electronic device ED may be anon-light emitting device. In such conditions, the electronic device ED may include electronic units EU, wherein the electronic units EU may be non-light emitting units, and the first surface FS of the substrate SB may include the active area DA. As shown in FIG. 1, the area enclosed by the connection line of the outermost electronic units EU among the electronic units EU may be defined as the active area DA. In some embodiments, the area enclosed by the connection line of the outermost control units CU may be defined as the active area DA. The shape of the active area DA shown in FIG. 1 is just exemplary, and the present disclosure is not limited thereto. In some embodiments, the active area DA may include any suitable shape.

The substrate SB of the present embodiment may for example include a rigid substrate, a flexible substrate or the combination of the above-mentioned substrates, but not limited thereto. The material of the rigid substrate may for example include glass, ceramic, quartz, sapphire or the combinations of the above-mentioned materials. The material of the flexible substrate may for example include polyimide (PI), polycarbonate (PC), polyethylene terephthalate (PET), other suitable materials or the combinations of the above-mentioned materials. It should be noted that although the substrate SB shown in FIG. 1 and FIG. 2 is a single layer structure, the present embodiment is not limited thereto. In some embodiments, the substrate SB may include a multilayer structure, such as a stacked structure of organic layer/ inorganic layer/organic layer, but not limited thereto.

The light emitting unit LEU may for example include any suitable self-emissive element or non-self-emissive element, but not limited thereto. The self-emissive element may for example include an organic light emitting diode (OLED), a quantum light-emitting diode (QLED), a light emitting diode (LED), any other suitable light emitting element or the combinations of the above-mentioned materials. The light emitting diode may for example include a mini light emitting diode (mini LED) or a micro light emitting diode (micro LED), but not limited thereto. In an embodiment, the chip size of the light emitting diode may range from 300 micrometers (μm) to 10 millimeters (mm), the chip size of the mini light emitting diode may range from 100 micrometers to 300 micrometers, and the chip size of the micro light emitting diode may range from 1 micrometer to 100 micrometers, but not limited thereto. The non-self-emissive element may for example include liquid crystal units, but not limited thereto. In the present embodiment, the light emitting units LEU of the light emitting device 100 may for example include light emitting elements capable of emitting light of various colors. As shown in FIG. 1, the electronic units EU of the electronic device ED may be light emitting units LEU, wherein the light emitting units LEU may include a plurality of first light emitting units LEU1, a plurality of second light emitting units LEU2 and a plurality of third light emitting units LEU3, wherein the first light emitting units LEU1, the second light emitting units LEU2 and the third light emitting units LEU3 may respectively arrange in a line extending along a first direction DR1 parallel to the surface (such as the first surface FS) of the substrate SB and disposed on the substrate SB, but not limited thereto. According to the present embodiment, the first light emitting units LEU1, the second light emitting units LEU2 and the third light emitting units LEU3 may for example emit red light, green light and blue light respectively, and the lights may be mixed into white light, but not limited thereto. In some embodiments, the light emitting device 100 may include the light emitting units LEU capable of emitting the light of a single color. The features of the light emitting units LEU in the following embodiments may refer to the content of the present embodiment, and will not be redundantly described.

Figure 5:
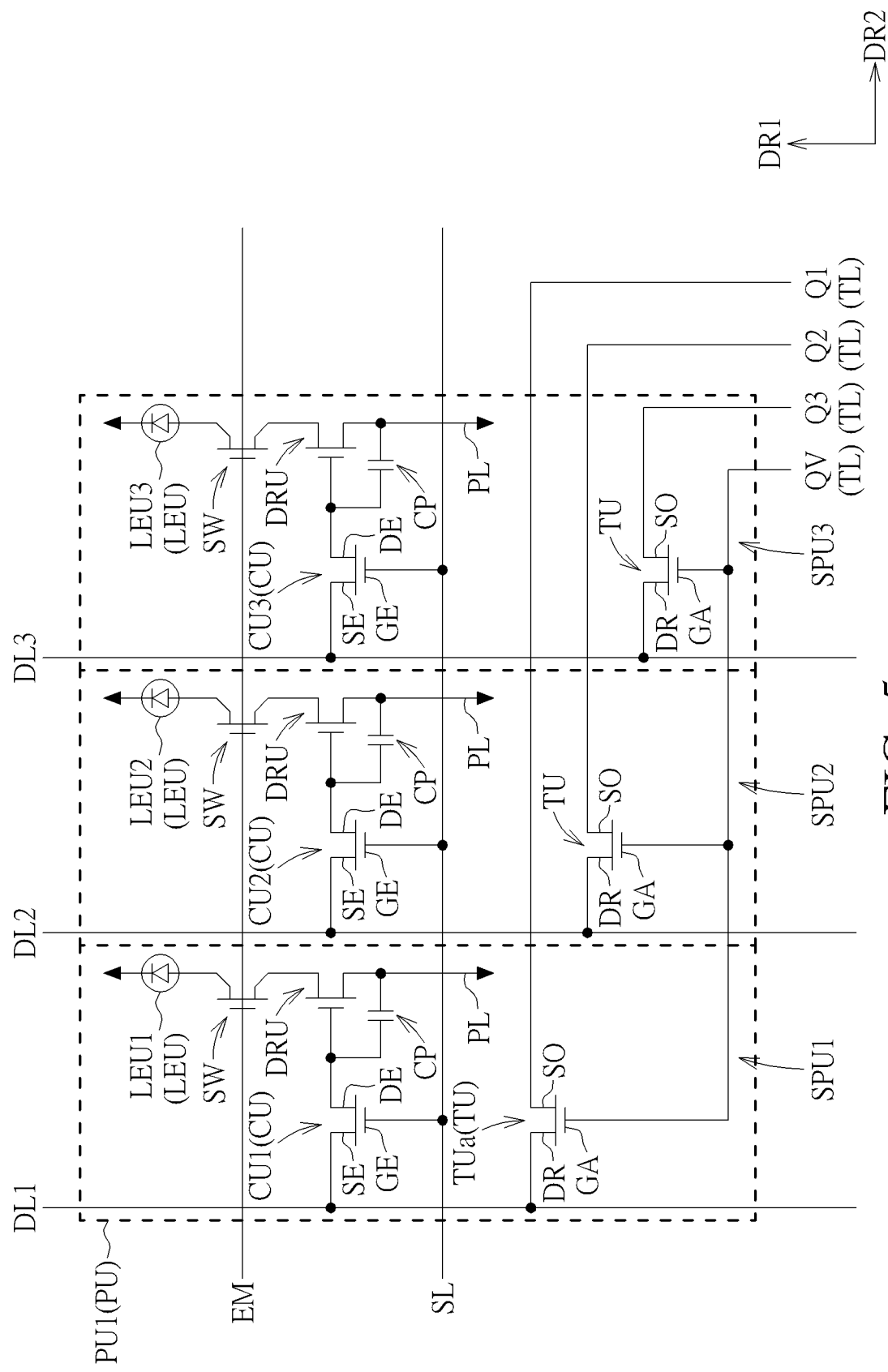
FIG. 5 schematically illustrates the circuit of the electronic device according to the first embodiment of the present disclosure.

As shown in FIG. 1, the light emitting device 100 may include a plurality of data lines DL extending along the first direction DR1. The light emitting device 100 may further include a plurality of scan lines SL (as shown in FIG. 5), wherein the scan lines SL may cross the data lines DL and be disposed on the substrate SB. The scan lines SL may extend along a second direction DR2, and the first direction DR1 may be different from the second direction DR2. For example, the first direction DR1 may be perpendicular to the second direction DR2, but not limited thereto. The data lines DL and the scan lines SL may include any suitable conductive material. According to the present embodiment, as shown in FIG. 1, the extending direction of the data lines DL may substantially be parallel to the extending direction of the individual arranging lines of the first light emitting units LEU1, the second light emitting units LEU2 and/or the third light emitting units LEU3, that is, the first direction DR1. In the present embodiment, the light emitting units LEU located in the same column in the first direction DR1 may be electrically connected to the same data line DL. For example, as shown in FIG. 1, in the first direction DR1, the first light emitting units LEU1 in the same column may be electrically connected to the data line DL1, the second light emitting units LEU2 in the same column may be electrically connected to the data line DL2, and the third light emitting units LEU3 in the same column may be electrically connected to the data line DL3, but not limited thereto. In addition, the light emitting units LEU located in the same row in the second direction DR2 may be electrically connected to the same scan line SL (as shown in FIG. 5) in the present embodiment, but not limited thereto. It should be noted that the number and disposition of the light emitting units LEU and the data lines DL shown in FIG. 1 are just exemplary, and the present disclosure is not limited thereto.

As shown in FIG. 5, in detail, the control unit CU may for example include a thin film transistor, which includes a gate GE, a source SE and a drain DE. The light emitting device 100 may include a plurality of control units CU. According to the present embodiment, one of the control units CU of the light emitting device 100 may for example be electrically connected between a light emitting unit LEU and a data line DL, thereby controlling the light emitting unit LEU to emit light. For example, the source SE of the control unit CU may be electrically connected to the data line DL, the drain DE of the control unit CU may be electrically connected to the light emitting unit LEU, and the gate GE of the control unit CU may be electrically connected to the scan line SL. When the scan line SL transmits the switch signal to the control unit CU and turns on the control unit CU, the data line DL may transmit the brightness signal to the light emitting unit LEU through the control unit CU, thereby controlling the light emission of the light emitting unit LEU, but not limited thereto. As shown in FIG. 1, the data line DL1 may be electrically connected to all of the first light emitting units LEU1 in the same column in the first direction DR1, so the brightness signal of the first light emitting units LEU1 in that column may be transmitted through the data line DL1, but not limited thereto. In addition, the light emitting device 100 of the present embodiment may further include power lines PL for electrically connecting the power source (not shown) to the light emitting units LEU, thereby providing voltage or current, but not limited thereto.

As shown in FIG. 1 and FIG. 2, according to the present embodiment, the data lines DL and the power lines PL of the light emitting device 100 may extend from the first surface FS of the substrate SB to the edge of the substrate SB and extend to the second surface RS of the substrate SB through the side surface SS of the substrate SB. The data lines DL and the power lines PL may respectively be electrically connected to the corresponding bonding pad BP on the second surface RS of the substrate SB, wherein the position of the bonding pads BP may substantially define the bonding area BA1 of the light emitting device 100, or in other words, the position of the bonding area BA1 may substantially overlap with the position of the bonding pads BP. In the present embodiment, the bonding area BA1 may be an area where any suitable peripheral electronic elements are bonded to the light emitting device 100. That is, the peripheral electronic elements (not shown) may be disposed on the second surface RS of the substrate SB of the light emitting device 100. For example, the peripheral electronic elements may include a brightness control chip electrically connected to the data lines DL to provide the brightness signal mentioned above, but not limited thereto. In some embodiments, although it is not shown in FIG. 1, the bonding pads BP on the second surface RS of the light emitting device 100 may be electrically connected to the scan lines SL, and the peripheral electronic elements may include a gate switch control chip electrically connected to the scan lines SL to provide the switch signal mentioned above. In some embodiments, the peripheral electronic elements may include other electronic elements suitable to be applied to the light emitting device 100.

Figure 3:
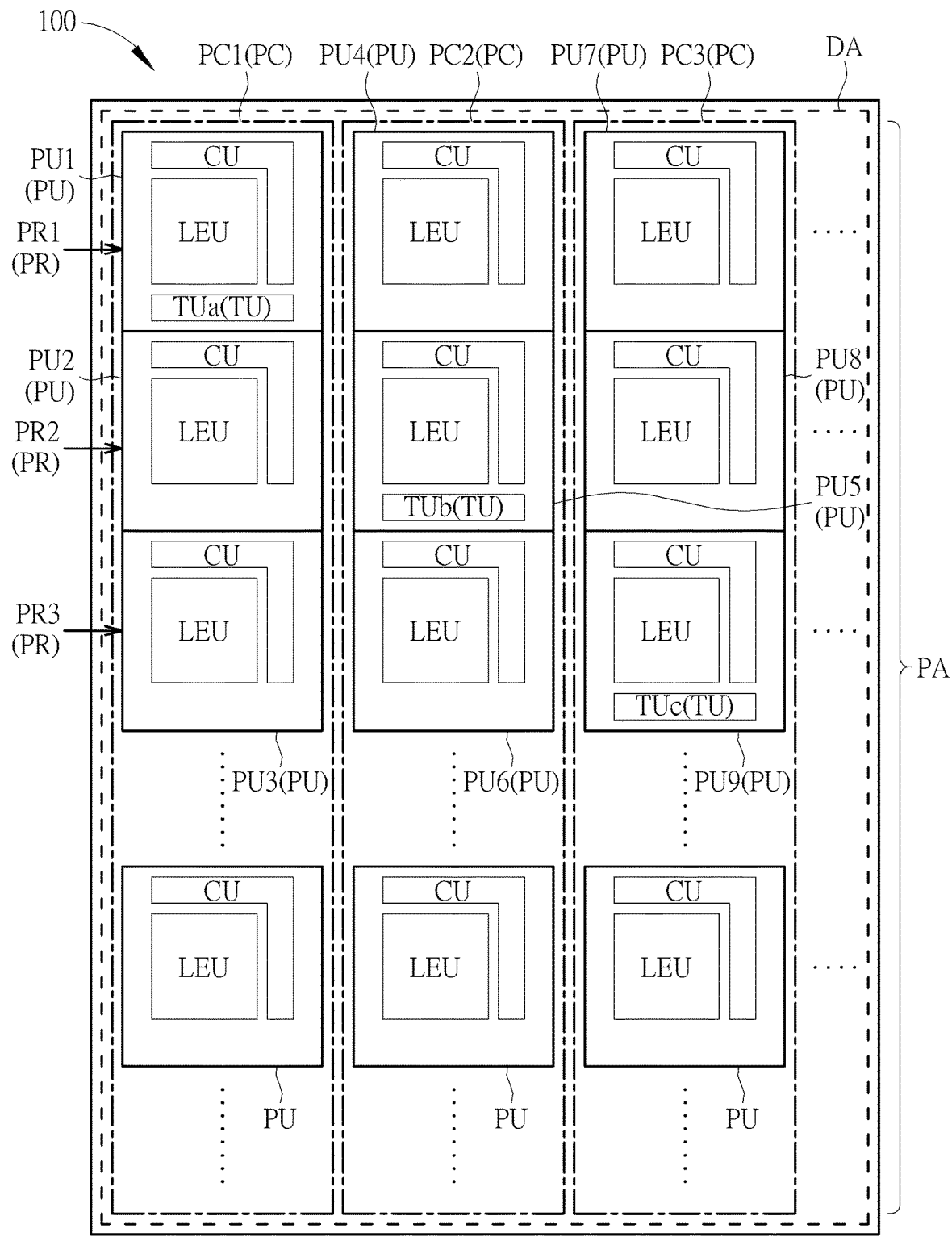
FIG. 3 and FIG. 4 schematically illustrate the configuration of test switch elements of the electronic device according to the first embodiment of the present disclosure.
Figure 4:
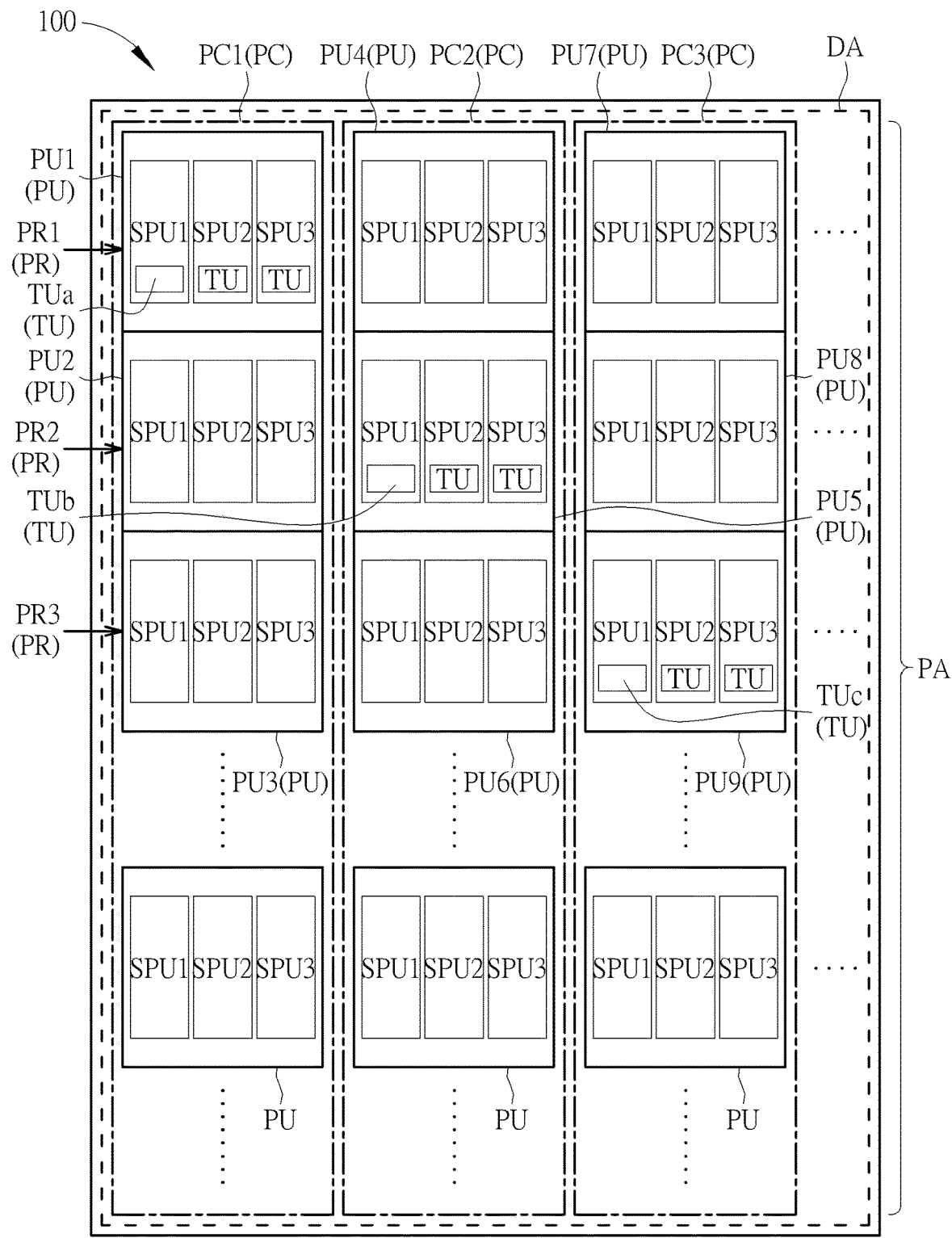

Referring to FIG. 3, FIG. 4 and FIG. 5, FIG. 3 and FIG. 4 schematically illustrate the configuration of test switch elements of the electronic device according to the first embodiment of the present disclosure, and FIG. 5 schematically illustrates the circuit of the electronic device according to the first embodiment of the present disclosure. In order to simplify the figures, elements such as the signal lines (data lines DL and scan lines SL) and the test signal lines TL are omitted in FIG. 3 and FIG. 4. As shown in FIG. 3, the light emitting device 100 may be divided into a plurality of pixel areas PU, and the pixel areas PU may be arranged along the first direction DR1 and the second direction DR2 to form an array PA.

The light emitting device 100 may include a plurality of light emitting units LEU, a plurality of control units CU and a plurality of test switch elements TU. According to some embodiments, at least one light emitting element LEU, at least one control unit CU and at least one test switch element TU are disposed in a pixel area PU, and the connection relationship thereof is mentioned above, which will not be redundantly described here. The plurality of pixel areas PU may include a plurality of pixel columns PC extending along the first direction DR1, such as a first pixel column PC1, a second pixel column PC2 and a third pixel column PC3 extending along the first direction DR1, but not limited thereto. The first pixel column PC1 may include the pixel area PU1, the pixel area PU2 and the pixel area PU3, the second pixel column PC2 may include the pixel area PU4, the pixel area PU5 and the pixel area PU6, and the third pixel column PC3 may include the pixel area PU7, the pixel area PU8 and the pixel area PU9. According to the present embodiment, at least one test switch element TU may be disposed in each pixel column PC to test the light emitting units LEU of the pixel areas PU in that pixel column PC. In detail, as shown in FIG. 3, the test switch elements TU may include a first test switch element TUa, a second test switch element TUb and a third test switch element TUc, wherein the first test switch element TUa may be disposed in the first pixel column PC1, the second test switch element TUb may be disposed in the second pixel column PC2, and the third test switch element TUc may be disposed in the third pixel column PC3, but not limited thereto. Therefore, the first test switch element TUa may be used to test the light emitting units LEU of all the pixel areas PU in the first pixel column PC1, the second test switch element TUb may be used to test the light emitting units LEU of all the pixel areas PU in the second pixel column PC2, and the third test switch element TUc may be used to test the light emitting units LEU of all the pixel areas PU in the third pixel column PC3.

In addition, as shown in FIG. 3, the pixel areas PU may include a plurality of pixel rows PR extending along the second direction DR2, such as the first pixel row PR1, the second pixel row PR2 and the third pixel row PR3. The first pixel row PR1 may for example include the pixel area PU1, the pixel area PU4, the pixel area PU7 and the pixel areas to the right thereof (not shown), the second pixel row PR2 may for example include the pixel area PU2, the pixel area PU5 and the pixel area PU8 and the pixel areas to the right thereof (not shown), and the third pixel row PR3 may for example include the pixel area PU3, the pixel area PU6 and the pixel area PU9 and the pixel areas to the right thereof (not shown). According to the present embodiment, the test switch elements TU located in different pixel columns PC may be disposed in different pixel rows PR. For example, as shown in FIG. 3, the first test switch element TUa may be located in the first pixel row PR1, the second test switch element TUb may be located in the second pixel row PR2, and the third test switch element TUc may be located in the third pixel row PR3, but not limited thereto. Since the test switch elements TU in different pixel columns PC may be disposed in different pixel rows PR, the flexibility of the disposition of other elements of the light emitting device 100 may be increased, thereby improving the spatial configuration of the light emitting device 100. As shown in FIG. 3, the first test switch element TUa may be disposed in the pixel area PU1, the second test switch element TUb may be disposed in the pixel area PU5, and the third test switch element TUc may be disposed in the pixel area PU9, but not limited thereto. According to some embodiments, the test switch elements TU may not be overlapped with each other or may be staggered with each other in the first direction DR1 and the second direction DR2. That is, the space occupied by the test switch elements TU in the display area DA may be more scattered. Therefore, the flexibility of the disposition of other elements of the light emitting device 100 may be increased, thereby improving the spatial configuration of the light emitting device 100.

According to some embodiments, the first test switch element TUa and the second test switch element TUb may be disposed in different columns. For example, as shown in FIG. 3, the first test switch element TUa may be disposed in the first pixel column PC1, and the second test switch element TUb may be disposed in the second pixel column PC2. According to some embodiments, the first test switch element TUa and the second test switch element TUb may be disposed in different rows. For example, as shown in FIG. 3, the first test switch element TUa may be disposed in the first pixel row PR1, and the second test switch element TUb may be disposed in the second pixel row PR2. According to some embodiments, the first test switch element TUa and the second test switch element TUb may be disposed in different pixel columns but in the same pixel row. According to some embodiments, the first test switch element TUa and the second test switch element TUb may be disposed in different pixel rows but in the same pixel column.

As shown in FIG. 3, the plurality of pixel areas PU may include the first pixel row PR1 and the second pixel row PR2 arranged along the second direction DR2. According to some embodiments, the first test switch element TUa and the second test switch element TUb may be disposed in different columns. For example, as shown in FIG. 3, the first test switch element TUa may be disposed in the first pixel column PC1, and the second test switch element TUb may be disposed in the second pixel column PC2. According to some embodiments, the first test switch element TUa and the second test switch element TUb may be disposed in different rows. For example, as shown in FIG. 3, the first test switch element TUa may be disposed in the first pixel row PR1, and the second test switch element TUb may be disposed in the second pixel row PR2. According to some embodiments, the first test switch element TUa and the second test switch element TUb may be disposed in different pixel columns but in the same pixel row. According to some embodiments, the first test switch element TUa and the second test switch element TUb may be disposed in different pixel rows but in the same pixel column.

As shown in FIG. 4, the light emitting device 100 may be divided into a plurality of sub-pixel areas. A pixel area PU may include at least two sub-pixel areas. For example, the first pixel column PC1 mentioned above may include a plurality of first sub-pixel areas SPU1 arranged along the first direction DR1 and a plurality of second sub-pixel areas SPU2 arranged along the first direction DR1. According to some embodiments, in detail, the first pixel column PC1 may include a plurality of first sub-pixel areas SPU1 arranged along the first direction DR1, a plurality of second sub-pixel areas SPU2 arranged along the first direction DR1 and a plurality of third sub-pixel areas SPU3 arranged along the first direction DR1. As shown in FIG. 5, at least one first light emitting unit LEU1, at least one control unit CU1 and at least one first test switch element TUa may be disposed in a first sub-pixel area SPU1, and the connection relationship thereof is mentioned above, which will not be redundantly described here. The first light emitting units LEU1 included in the first sub-pixel areas SPU1 and the second light emitting units LEU2 included in the second sub-pixel areas SPU2 may be light emitting units of the same color or different colors, and the present disclosure is not limited thereto. According to some embodiments, the first light emitting units LEU1 included in the first sub-pixel areas SPU1, the second light emitting units LEU2 included in the second sub-pixel areas SPU2 and the third light emitting units LEU3 included in the third sub-pixel areas SPU3 may be light emitting units of different colors. For example, the first light emitting units LEU1, the second light emitting units LEU2 and the third light emitting units LEU3 may respectively emit red light, green light and blue light, the present disclosure is not limited thereto. A first sub-pixel area SPU1, a second sub-pixel area SPU2 and a third sub-pixel area SPU3 may form a pixel area PU of the light emitting device 100.

As shown in FIG. 1, according to the present embodiment, the test switch element TU may be electrically connected to the data line DL, and the test switch element TU may be electrically connected to the control unit CU and the light emitting unit LEU through the data line DL. Specifically, the test switch element TU of the present embodiment may for example include a thin film transistor, which includes a gate GA, a source SO and a drain DR, wherein the drain DR of the test switch element TU may be electrically connected to the data line DL, thereby electrically connecting to the control unit CU and the light emitting unit LEU electrically connected to that data line DL, but not limited thereto. In addition, the light emitting device 100 of the present embodiment may further include a plurality of test signal lines TL disposed on the substrate SB, wherein the gate GA and the source SO of the test switch element TU may respectively be electrically connected to the corresponding test signal line TL. As shown in FIG. 1 and FIG. 2, the test signal line TL electrically connected to the test switch element TU may extend from the first surface FS of the substrate SB to the edge of the substrate SB, and extend to the second surface RS of the substrate SB through the side surface SS of the substrate SB. The material of the test signal lines TL may refer to the materials of the data lines DL and the scan lines SL mentioned above, and will not be redundantly described. In addition, as shown in FIG. 2, the test signal lines TL may respectively be electrically connected to the corresponding test pad TP through the bonding pads BP at the second surface RS of the substrate SB in the present embodiment. That is, the test signal line TL may be electrically connected between the test pad TP and the test switch element TU. Therefore, the test pad TP may be electrically connected to the light emitting unit LEU through the test signal line TL, the test switch element TU, the data line DL and the control unit CU, but not limited thereto. Moreover, as shown in FIG. 2, the second surface RS of the substrate SB may further include a bonding area BA2 in addition to the above-mentioned bonding area BA1, wherein the position of the bonding area BA2 may substantially correspond to the position of the bonding pads BP between the test pads TP and the test signal lines TL, such that the peripheral electronic elements may be electrically connected to the bonding pads BP and the test signal lines IL when they are disposed in the bonding area BA2, but not limited thereto.

As shown in FIG. 1, in the present embodiment, a test switch element TU may be electrically connected to a data line DL, thereby testing all of the light emitting units LEU electrically connected to that data line DL. In detail, as shown in FIG. 1, the drain DR of the test switch element TU1 may be electrically connected to the data line DL1, the source SO of the test switch element TU1 may be electrically connected to the test signal line Q1, and the gate GA of the test switch element TU1 may be electrically connected to the test signal line QV. When testing the light emitting units LEU, the test signal line QV may transmit a switch signal (such as a voltage signal or a current signal) to the gate GA of the test switch element TU1, thereby turning on the test switch element TU1. At this time, a test signal may be transmitted through the test signal line Q1, wherein the test signal may be transmitted to all of the first light emitting units LEU1 electrically connected to the data line DL1 through the test signal line Q1, the test switch element TU1, the data line DL1 and the control unit CU1, thereby testing all of the first light emitting units LEU1 electrically connected to the data line DL1. That is, in the test stage, the test signal transmitted by the test switch element TU1 may replace the brightness signal transmitted by the data line DL1. When the test is not performed, the test switch element TU1 may be turned off. Similarly, in the test stage of the light emitting units LEU, the test signal line QV may transmit the switch signal to the gate GA of the test switch element TU2, and the test signal may be transmitted to all of the second light emitting units LEU2 electrically connected to the data line DL2 through the test signal line Q2, the test switch element TU2, the data line DL2 and the control unit CU2, thereby testing all of the second light emitting units LEU2 electrically connected to the data line DL2; the test signal line QV may transmit the switch signal to the gate GA of the test switch element TU3, and the test signal may be transmitted to all of the third light emitting units LEU3 electrically connected to the data line DL3 through the test signal line Q3, the test switch element TU3, the data line DL3 and the control unit CU3, thereby testing all of the third light emitting units LEU3 electrically connected to the data line DL3. The above-mentioned switch signal and test signal may for example be provided by the peripheral electronic element, wherein the peripheral electronic element may for example be disposed in the bonding area BA2 shown in FIG. 2 and electrically connected to the test signal line TL, but not limited thereto. In addition, the test pad TP disposed on the second surface RS of the substrate SB may be used to perform a light on test after the light emitting units LEU are disposed on the substrate SB to confirm whether the light emitting units LEU are damaged, thereby improving the yield of the light emitting device 100.

In traditional light emitting devices, test elements are usually disposed in the peripheral area of the light emitting device. However, such a configuration may result in an excessive large space of the peripheral area, thereby reducing the screen-to-body ratio of the device. In contrast, since the test switch elements TU of the present disclosure may be disposed in the display area DA of the substrate SB, the space requirement of the peripheral area of the light emitting device 100 may be reduced. In addition, since the elements included in the light emitting device 100 (such as the light emitting units LEU, the control units CU and/or the test switch elements TU) may be disposed in the display area DA, and the peripheral electronic elements and the wirings such as the signal lines and the test signal lines TL may extend to the second surface RS of the substrate SB, the light emitting device 100 may not include the peripheral area, or the peripheral area occupies a small portion of the light emitting device 100. In other words, the display area DA of the light emitting device 100 may substantially overlap the surface area of the substrate SB, such that the screen-to-body ratio of the light emitting device 100 may be increased, thereby improving the display effect of the light emitting device 100. It should be noted that "the display area DA may substantially overlap the surface area of the substrate SB"

mentioned above represents that the area of the display area DA may substantially be the same as the area of the surface of the substrate SB, but the difference due to the tolerance of the manufacturing process of the light emitting device 100 is allowable. In addition, when traditional light emitting devices are applied to tiled display devices, it may be harmful for tiling since the test elements are disposed in the peripheral area, or a sense of seam may be observed from the formed tiled display device, thereby affecting the display of the device. Therefore, in order to reduce the sense of seam of the tiled display device, tiling of the light emitting device may be performed after the peripheral area (including the test elements) is removed in the traditional light emitting devices. However, this method will result in the inability to test the light emitting units in the subsequent manufacturing process, thereby affecting the yield of the tiled display device. In contrast, since the test switch element TU may be disposed in the display area DA to reduce the space requirement of the peripheral area of the light emitting device 100 in the present embodiment, when the light emitting device 100 is applied to tiled display devices, the sense of seam of the formed tiled display device may be reduced, thereby improving the user's experience. In addition, even though the light emitting devices 100 are tiled to form the tiled display device, the test switch element TU disposed in the display area DA may also be used to test the light emitting units LEU. Therefore, the yield of the tiled display device formed of the light emitting device 100 of the present disclosure may be improved.

It should be noted that FIG. 1 just exemplarily shows the structure that the test switch elements TU are disposed in the display area DA, and the positions of the test switch elements TU of the present embodiment are not limited to what is shown in FIG. 1. The positions of the test switch elements TU in the display area DA of the present embodiment will be detailed in the following.

It should be noted that the number of the test switch elements TU included in each of the pixel columns PC may be adjusted according to the design of the pixel area PU in the present embodiment, which is not limited to what is shown in FIG. 3. For example, as shown in FIG. 4, when the pixel area PU includes the first sub-pixel area SPU1, the second sub-pixel area SPU2 and the third sub-pixel area SPU3 mentioned above, each of the pixel columns PC may include the plurality of first sub-pixel areas SPU1, the plurality of second sub-pixel areas SPU2 and the plurality of third sub-pixel areas SPU3 respectively arranged along the first direction DR1. In such condition, each of the pixel columns PC may for example include three test switch elements TU respectively located in one of the first sub-pixel areas SPU1, one of the second sub-pixel areas SPU2 and one of the third sub-pixel areas SPU3 of that pixel column PC. Take the first pixel column PC1 as an example, the first pixel column PC1 may include three test switch elements TU respectively located in the first sub-pixel area SPU1, the second sub-pixel area SPU2 and the third sub-pixel area SPU3 of the pixel area PU1, but not limited thereto. According to the present embodiment, the test switch element TU disposed in the first sub-pixel area SPU1 of the pixel area PU1 may be electrically connected to all of the first sub-pixel areas SPU1 in the first pixel column PC1 for testing the first light emitting units LEU1 in those first sub-pixel areas SPU1. Similarly, the test switch element TU disposed in the second sub-pixel area SPU2 of the pixel area PU1 may be used to test the second light emitting units LEU2 in all of the second sub-pixel areas SPU2 in the first pixel column PC1, and the test switch element TU disposed in the third sub-pixel area SPU3 of the pixel area PU1 may be used to test the third light emitting units LEU3 in all of the third sub-pixel areas SPU3 in the first pixel column PC1.

FIG. 5 shows the schematic diagram of the circuit structure of the pixel areas PU including the test switch elements TU in the present embodiment. For example, FIG. 5 may for example show the circuit structure of the pixel area PU1 shown in FIG. 4, but not limited thereto. As shown in FIG. 5, the pixel area PU1 may include the first sub-pixel area SPU1, the second sub-pixel area SPU2 and the third sub-pixel area SPU3, wherein the first sub-pixel area SPU1 includes the first light emitting unit LEU1 and the control unit CU1, the second sub-pixel area SPU2 may include the second light emitting unit LEU2 and the control unit CU2, and the third sub-pixel area SPU3 may include the third light emitting unit LEU3 and the control unit CU3. In addition, the first light emitting unit LEU1 may be electrically connected to the data line DL1 through the control unit CU1, the second light emitting unit LEU2 may be electrically connected to the data line DL2 through the control unit CU2, and the third light emitting unit LEU3 may be electrically connected to the data line DL3 through the control unit CU3. According to the present embodiment, as shown in FIG. 5, the first sub-pixel area SPU1, the second sub-pixel area SPU2 and the third sub-pixel area SPU3 may respectively include a capacitor element CP, a driving unit DRU and a switch control unit SW, wherein the driving unit DRU and the switch control element SW may be electrically connected between the light emitting unit LEU and the control unit CU, but not limited thereto. The capacitor element CP may be used to maintain the voltage of the light emitting unit LEU to ensure the display of the light emitting unit LEU. An end of the capacitor element CP may be electrically connected to the gate of the driving unit DRU, and another end of the capacitor element CP may be electrically connected to the source of the driving unit DRU, but not limited thereto. The gate of the driving unit DRU may be electrically connected to the drain DE of the control unit CU, the source of the driving unit DRU may be electrically connected to the voltage source (such as the power line PL), and the drain of the driving unit DRU may be electrically connected to the source of the switch control unit SW. When the control unit CU transmits the brightness signal to the gate of the driving unit DRU and turns on the driving unit DRU, the driving unit DRU may transmit the voltage signal or the current signal to the drain of the switch control unit SW. The gate of the switch control unit SW is electrically connected to the brightness control line EM, and the drain of the switch control unit SW is electrically connected to the light emitting unit LEU. By controlling the turn on/turn off state of the switch control unit SW through the brightness control line EM, the light emission of the light emitting unit LEU may be controlled. It should be noted that the driving circuit of the light emitting device 100 of the present disclosure is not limited to what is shown in FIG. 5, and may include any suitable driving circuit.

Figure 6:
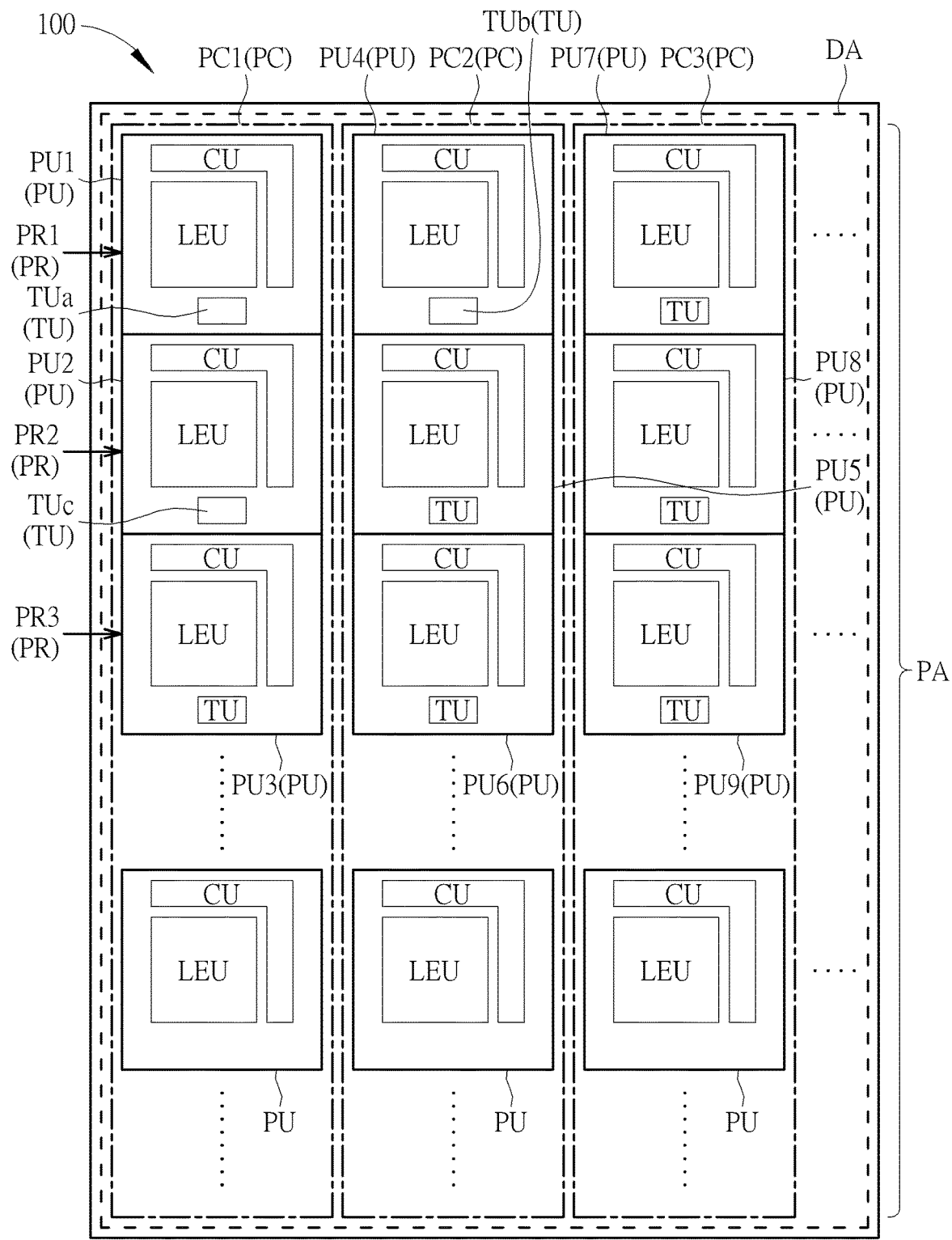
FIG. 6 and FIG. 7 schematically illustrate the configuration of test switch elements of an electronic device according to a second embodiment of the present disclosure.
Figure 7:
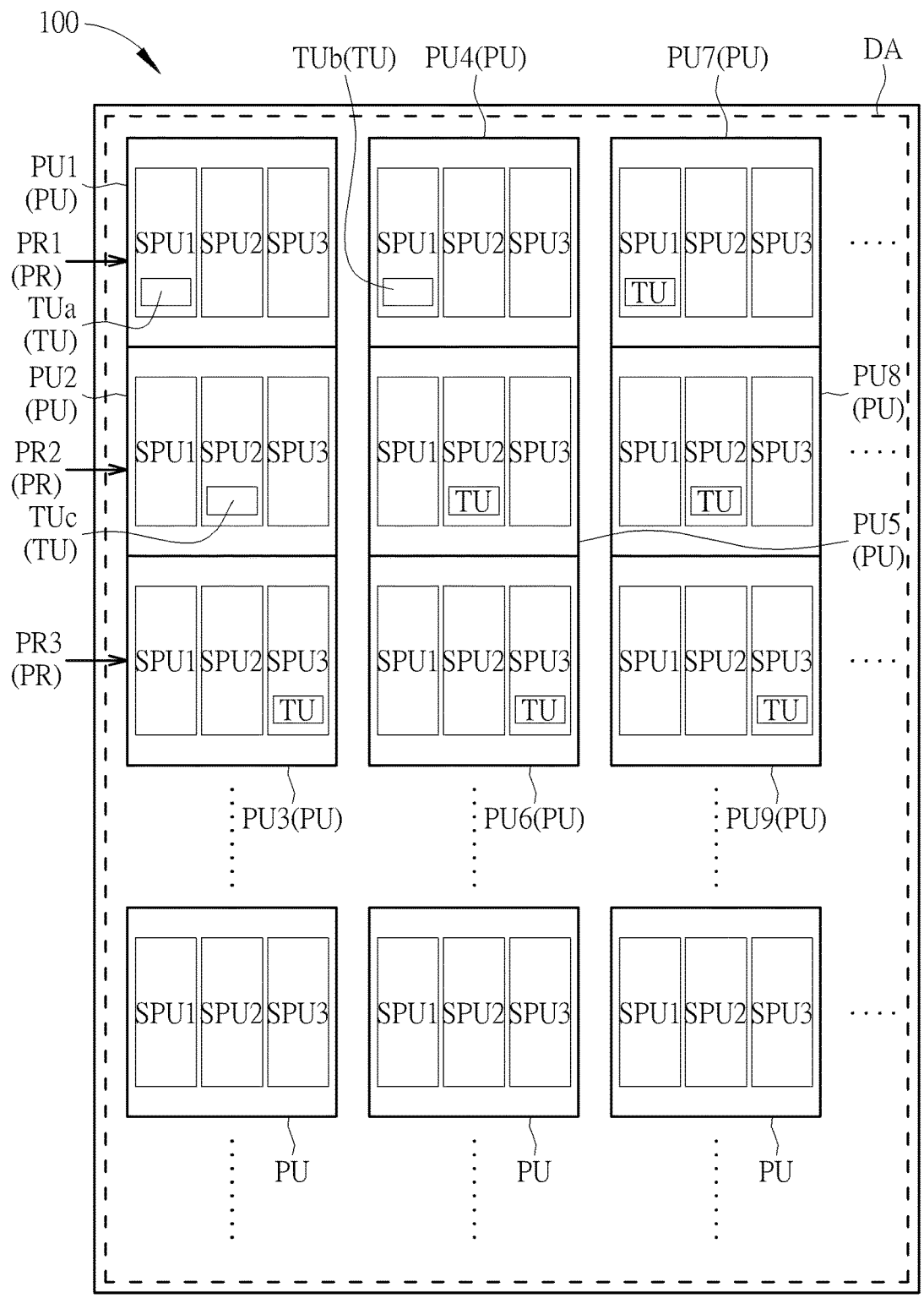
Figure 8:
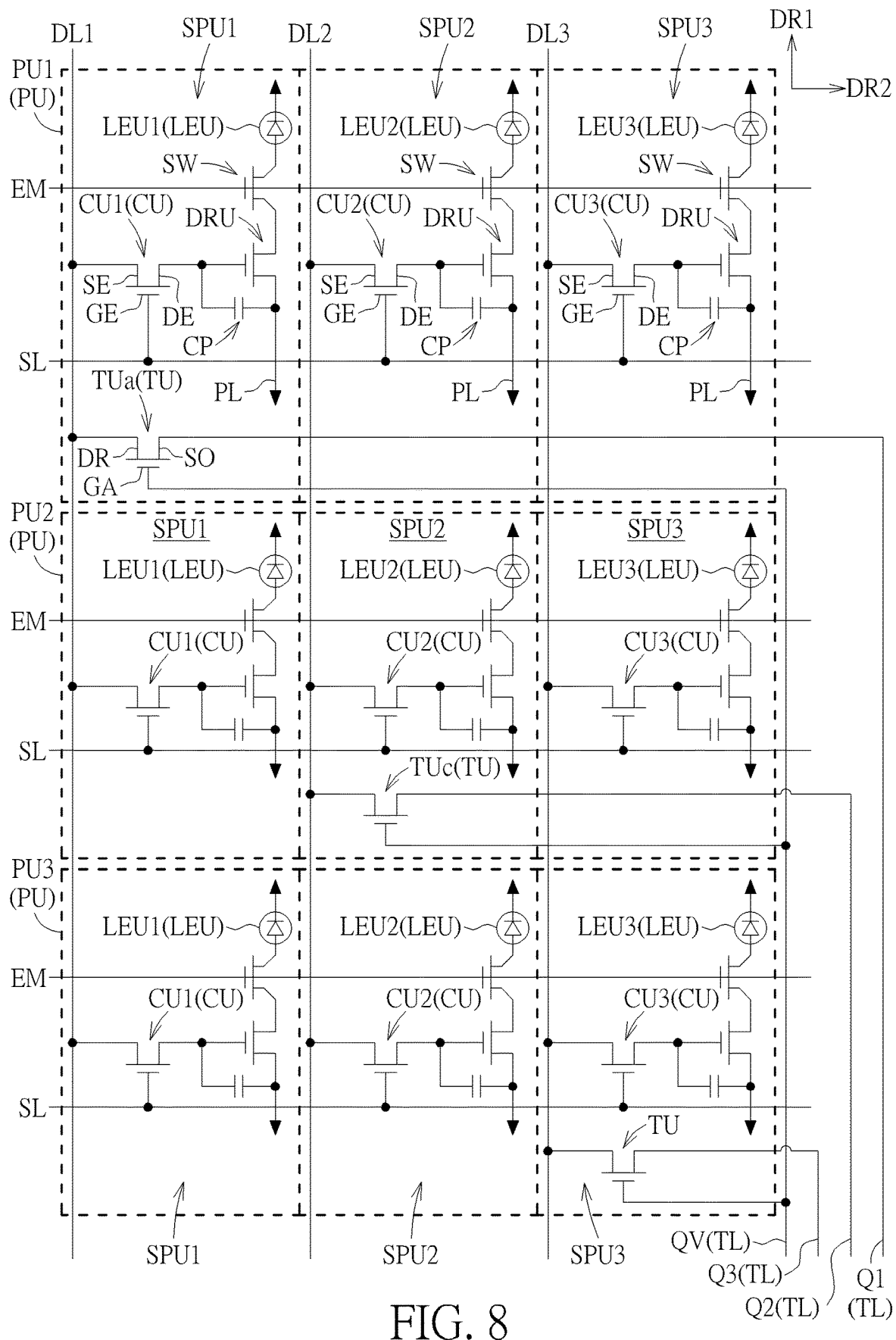
FIG. 8 schematically illustrates the circuit of the electronic device according to the second embodiment of the present disclosure.

Referring to FIG. 6, FIG. 7 and FIG. 8, FIG. 6 and FIG. 7 schematically illustrate the configuration of test switch elements of an electronic device according to a second embodiment of the present disclosure, and FIG. 8 schematically illustrates the circuit of the electronic device according to the second embodiment of the present disclosure. In order to simplify the figures, elements such as the signal lines (data lines DL and scan lines SL) and the test signal lines TL are omitted in FIG. 6 and FIG. 7. In addition, the features of the elements shown in FIG. 6, FIG. 7 and FIG. 8 may respectively refer to the contents of FIG. 3, FIG. 4 and FIG.

5 mentioned above, and will not be redundantly described. As shown in FIG. 7, the pixel areas PU of the present embodiment may include the first sub-pixel areas SPU1, the second sub-pixel areas SPU2 and the third sub-pixel areas SPU3. Three test switch elements TU may be disposed in a pixel column PC, and the three test switch elements TU may respectively be located in one of the first sub-pixel areas SPU1, one of the second sub-pixel areas SPU2 and one of the third sub-pixel areas SPU3. According to the present embodiment, the three test switch elements TU in a pixel column PC may respectively be disposed in different pixel rows PR of the pixel column PC. For example, as shown in FIG. 6 and FIG. 7, in the first pixel column PC1, the first test switch element TUa may be disposed in the first sub-pixel area SPU1, the third test switch element TUc may be disposed in the second sub-pixel area SPU2. In the second pixel column PC2, the second test switch element TUb may be disposed in the first pixel row PR1. The first test switch element TUa may be disposed in the first pixel row PR1. The first test switch element TUa may be disposed in the first pixel row PR1, and the third test switch element TUc may be located in the second pixel row PR2 different from the first pixel row PR1, but not limited thereto.

As shown in FIG. 7, in the first pixel column PC1, the test switch element TU may further be disposed in the third sub-pixel area SPU3, wherein the test switch element TU may be located in the third pixel row PR3 different from the first pixel row PR1 and the second pixel row PR2. The disposition ways of the test switch elements TU in the second pixel column PC2 and the third pixel column PC3 are similar to the disposition way of the test switch elements TU in the first pixel column PC1, and will not be redundantly described. In some embodiments, the three test switch elements TU in the first pixel column PC1 (or the second pixel column PC2 or the third pixel column PC3) may respectively be located in any three pixel areas PU of the first pixel column PC1 (or the second pixel column PC2 or the third pixel column PC3), which is not limited to what is shown in FIG. 6 and FIG. 7.

In addition, according to the disposition way of the test switch elements TU of the present embodiment, the test switch elements TU located in different pixel columns PC may be located in the same pixel row PR in the second direction DR2. For example, as shown in FIG. 6 and FIG. 7, the first test switch element TUa located in the first sub-pixel area SPU1 of the first pixel column PC1 and the second test switch element TUb located in the first sub-pixel area SPU1 of the second pixel column PC2 may be located in the same first pixel row PR1, but not limited thereto.

According to some embodiments, as shown in FIG. 7, the first pixel column PC1 includes the plurality of first sub-pixel areas SPU1 and the plurality of second sub-pixel areas SPU2 arranged along the first direction DR1. The first test switch element TUa may be disposed in one of the plurality of first sub-pixel areas SPU1, and the third test switch element TUc may be disposed in one of the plurality of second sub-pixel areas SPU2. According to some embodiments, the first test switch element TUa and the third test switch element TUc may be disposed in different pixel rows. For example, the first test switch element TUa may be disposed in the first pixel row PR1, and the third test switch element TUc may be disposed in the second pixel row PR2. Moreover, in the first pixel column PC1, the test switch element TU may be disposed in the third pixel row PR3. According to some embodiments, in the first pixel column PC1, the first light emitting units may be disposed in the first sub-pixel areas SPU1, the second light emitting units may be disposed in the second sub-pixel areas SPU2, and the third light emitting units may be disposed in the third sub-pixel areas SPU3, wherein the first light emitting unit, the second light emitting unit and the third light emitting unit are light emitting units of different colors. For example, the first light emitting unit, the second light emitting unit and the third light emitting unit may respectively emit red light, green light and blue light, but not limited thereto. According to some embodiments, the first light emitting unit, the second light emitting unit and the third light emitting unit may emit lights of the same color.

FIG. 8 shows a schematic diagram of the circuit structure of the pixel area PU1, the pixel area PU2 and the pixel area PU3 shown in FIG. 6 and FIG. 7. As shown in FIG. 8, the test switch element TU (that is, the first test switch element TUa) disposed in the first sub-pixel area SPU1 of the pixel area PU1 may be electrically connected to the first light emitting units LEU1 in all of the first sub-pixel areas SPU1 in the first pixel column PC1 through the data line DL1 to test those first light emitting units LEU1. Similarly, the test switch element TU (that is, the third test switch element TUc) disposed in the second sub-pixel area SPU2 of the pixel area PU2 may be electrically connected to the second light emitting units LEU2 in all of the second sub-pixel areas SPU2 in the first pixel column PC1 through the data line DL2 to test those second light emitting units LEU2, and the test switch element TU disposed in the third sub-pixel area SPU3 of the pixel area PU3 may be electrically connected to the third light emitting units LEU3 in all of the third sub-pixel areas SPU3 in the first pixel column PC1 through the data line DL3 to test those third light emitting units LEU3. It should be noted that although the different pixel columns PC have the same disposition way of the test switch elements TU in the structures shown in FIG. 6, FIG. 7 and FIG. 8, the present disclosure is not limited thereto. In the present disclosure, different pixel columns PC may have different disposition ways of the test switch elements TU. For example, in some embodiments, the test switch elements TU in the first pixel column PC1 may be disposed in the way shown in FIG. 6, FIG. 7 and FIG. 8, and the test switch elements TU in the second pixel column PC2 may be disposed in the way shown in FIG. 3, FIG. 4 and FIG. 5, but not limited thereto.

According to the present embodiment, since different test switch elements TU in the same pixel column PC may not be located in the same pixel row PR in the second direction DR2, the test switch elements TU may be disposed dispersedly in the display area DA, thereby improving the design flexibility. In addition, the influence of the test switching element TU on the display effect of the light emitting device 100 may be reduced. In addition, since each of the test switch elements TU in the same pixel column PC may respectively be disposed corresponding to the sub-pixel area including the light emitting units LEU tested by the test switch element TU, the design of the test switch elements TU and related wiring can be simplified, thereby simplifying the process of the light emitting device 100.

Figure 9:
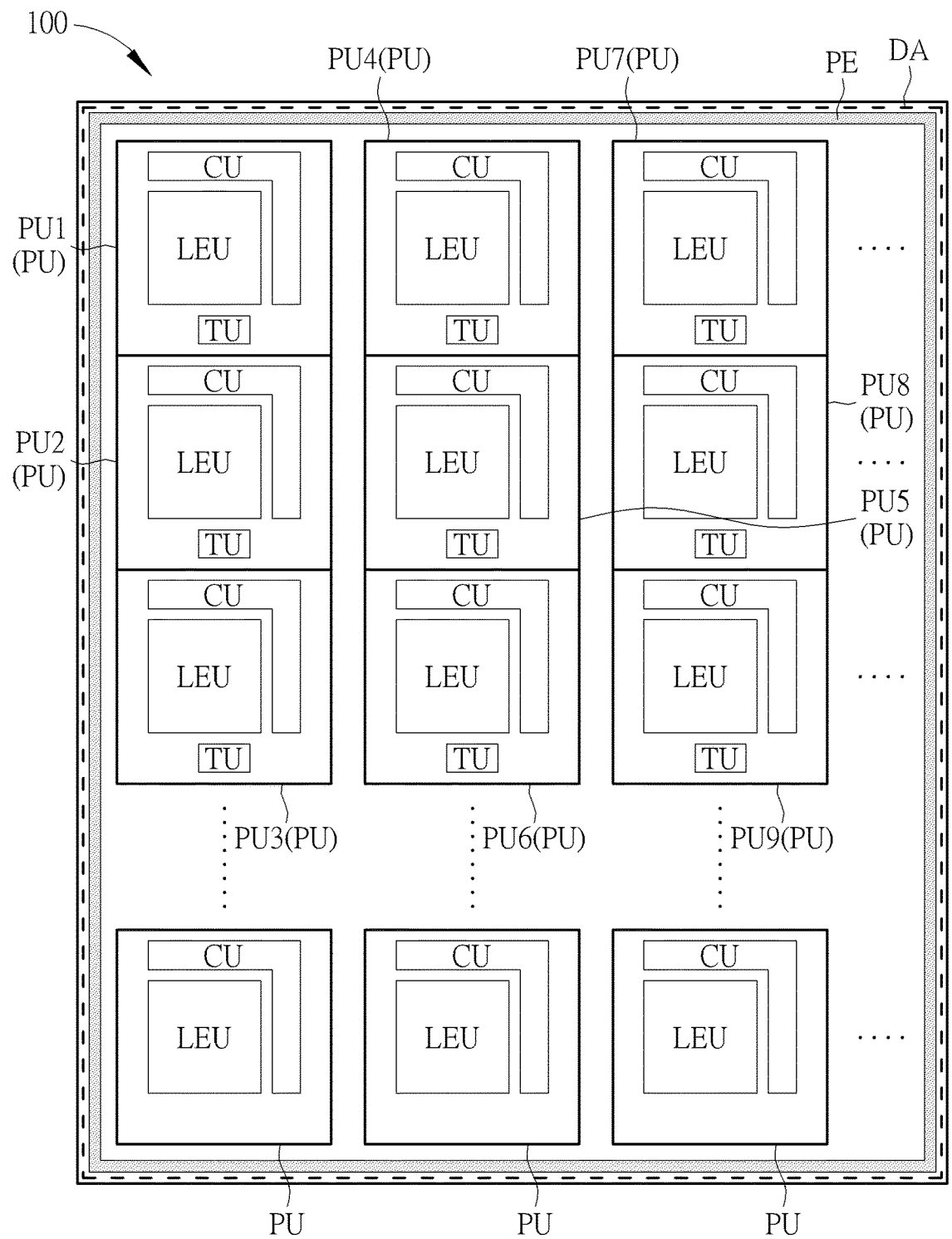
FIG. 9 is a block diagram of an electronic device according to a third embodiment of the present disclosure.
Figure 10:
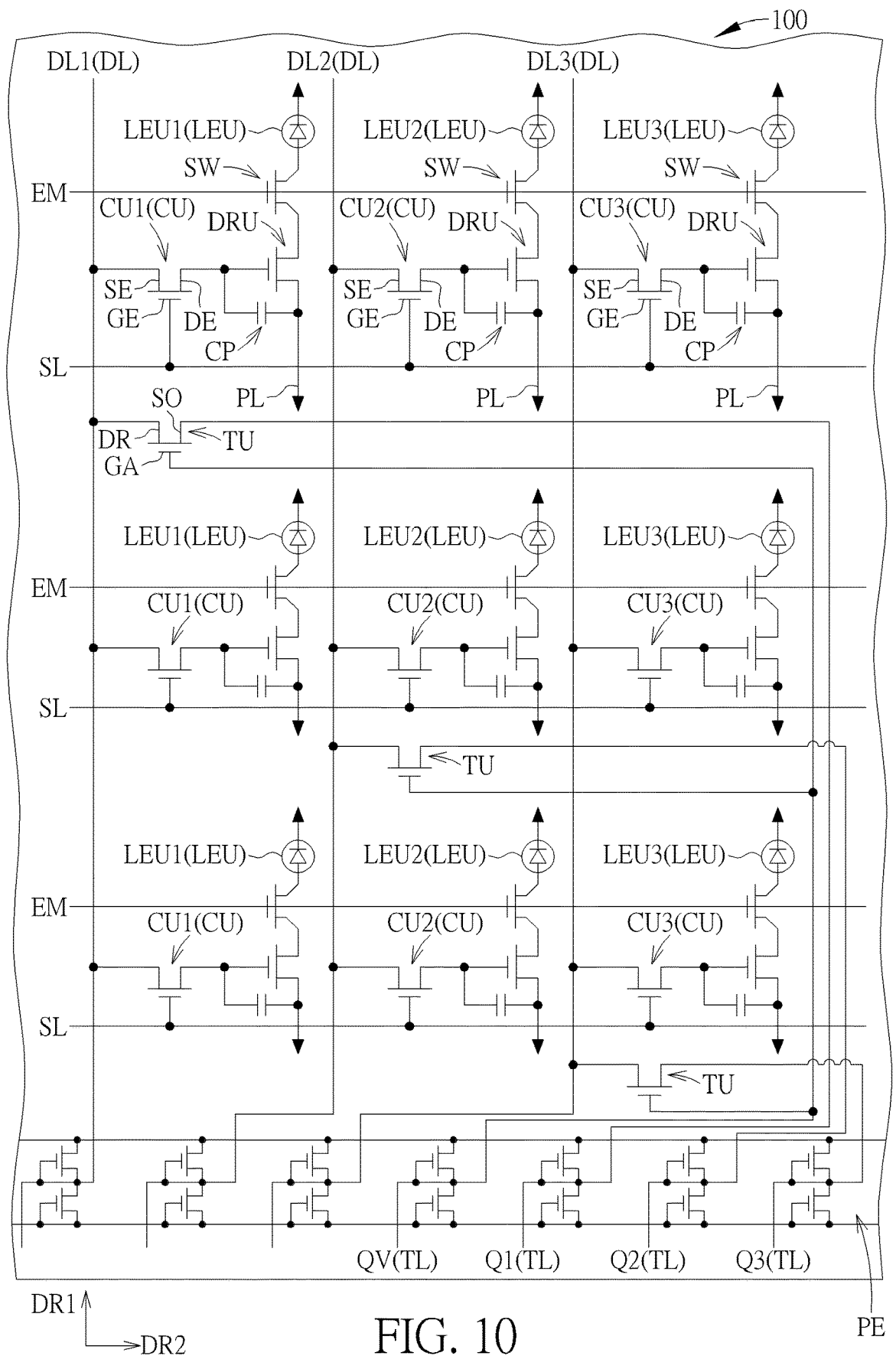
FIG. 10 schematically illustrates the circuit of the electronic device according to the third embodiment of the present disclosure.

Referring to FIG. 9 and FIG. 10, FIG. 9 is a block diagram of an electronic device according to a third embodiment of the present disclosure, and FIG. 10 schematically illustrates the circuit of the electronic device according to the third embodiment of the present disclosure. It should be noted that although the disposition way of the test switch elements TU shown in FIG. 9 is the same as the disposition way shown in FIG. 6, FIG. 7 and FIG. 8, the present disclosure is not limited thereto. According to the present embodiment, the light emitting device 100 may further include an electrostatic discharge element PE disposed on the first surface FS of the substrate SB in addition to the above-mentioned elements. In detail, the electrostatic discharge element PE may be disposed at the edge of the display area DA in the present embodiment. For example, the electrostatic discharge element PE may be disposed outside the outermost pixel areas PU. According to some embodiments, the electrostatic discharge element PE may surround all of the pixel areas PU and form a frame structure. According to some embodiments, a distance may be included between the electrostatic discharge element PE and the display area DA. In detail, the electrostatic discharge element PE may surround the test switch elements TU in the pixel areas PU. The electrostatic discharge element PE of the present embodiment may include any suitable type of electrostatic discharge (ESD) protection element, such as the ESD diode, but not limited thereto. FIG. 10 shows one of the embodiments of the electrostatic discharge element PE. It should be noted that in order to simplify the figure, FIG. 10 just shows the electrostatic discharge element PE in a side of the display area DA, but the present disclosure is not limited thereto. As shown in FIG. 10, the signal line (such as the data line DL, but not limited thereto) and the test signal lines TL of the light emitting device 100 may be electrically connected to the electrostatic discharge element PE (ESD protection circuit). Therefore, the signal lines and the test signal lines TL may be protected by the electrostatic discharge element PE, thereby reducing the possibility of damage to the signal lines and the test signal lines TL due to electrostatic discharge. It should be noted that although it is not shown in FIG. 10, the scan lines SL of the light emitting device 100 may be electrically connected to the electrostatic discharge element PE, such that the scan lines SL may be protected by the electrostatic discharge element PE. According to some embodiments, the electrostatic discharge element PE may be disposed on the first surface FS of the substrate SB and located in the area outside the display area DA.

In summary, the light emitting device including the test switch elements disposed in the display area thereof is provided by the present disclosure. Accordingly, the space requirement of the peripheral area of the light emitting device may be reduced, or the light emitting device may not include the peripheral area, thereby improving the screen-to-body ratio of the light emitting device. In addition, the sense of seam of the tiled display device formed of the light emitting device of the present disclosure may be reduced, thereby improving the user's experience. Moreover, even though the light emitting devices of the present disclosure are tiled to form the tiled display device, the test switch element disposed in the display area may also be used to test the light emitting units. Therefore, the yield of the tiled display device formed of the light emitting device of the present disclosure may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a substrate including a first surface and a second surface opposite to the first surface, wherein the first surface includes an active area;
an electronic unit disposed on the substrate and located in the active area;
a data line disposed on the substrate;
a control unit disposed on the substrate and located in the active area, wherein the control unit is electrically connected between the electronic unit and the data line;
a test pad disposed on the second surface of the substrate; and
a test switch element disposed on the substrate and located in the active area, wherein the test switch element is electrically connected between the data line and the test pad.

2. The electronic device according to claim 1, wherein the electronic device comprises:
a plurality of the test switch elements, wherein the plurality of test switch elements include a first test switch element and a second test switch element,
wherein the electronic device is divided into a plurality of pixel areas, the plurality of pixel areas include a first pixel column and a second pixel column extending along a first direction, the first test switch element is disposed in the first pixel column, and the second test switch element is disposed in the second pixel column.

3. The electronic device according to claim 2, wherein the plurality of pixel areas include a first pixel row and a second pixel row extending along a second direction, the first direction is different from the second direction, the first test switch element is disposed in the first pixel row, and the second test switch element is disposed in the second pixel row.

4. The electronic device according to claim 2, wherein the plurality of pixel areas include a first pixel row extending along a second direction, the first direction is different from the second direction, and the first test switch element and the second test switch element are disposed in the first pixel row.

5. The electronic device according to claim 2, wherein the first pixel column includes a plurality of first sub-pixel areas and a plurality of second sub-pixel areas arranged along the first direction, the plurality of test switch elements further include a third test switch element, the first test switch element is disposed in one of the plurality of first sub-pixel areas, and the third test switch element is disposed in one of the plurality of second sub-pixel areas.

6. The electronic device according to claim 5, wherein the plurality of pixel areas include a first pixel row and a second pixel row extending along a second direction, the first direction is different from the second direction, the first test switch element is disposed in the first pixel row, and the third test switch element is disposed in the second pixel row.

7. The electronic device according to claim 5, wherein the first pixel column further includes a plurality of third sub-pixel areas along the first direction, the plurality of test switch elements further include a fourth test switch element, and the fourth test switch element is disposed in one of the plurality of third sub-pixel areas.

8. The electronic device according to claim 7, wherein the plurality of pixel areas include a first pixel row, a second pixel row and a third pixel row extending along a second direction, the first direction is different from the second direction, the first test switch element is disposed in the first pixel row, the third test switch element is disposed in the second pixel row, and the fourth test switch element is disposed in the third pixel row.

9. The electronic device according to claim 5, wherein the electronic device includes a plurality of the electronic units, the plurality of electronic units include a first light emitting unit and a second light emitting unit, the first light emitting unit is located in one of the plurality of first sub-pixel areas, the second light emitting unit is located in one of the plurality of second sub-pixel areas, and the first light emitting unit and the second light emitting unit are light emitting units of different colors.

10. The electronic device according to claim 5, wherein the electronic device includes a plurality of first electronic units respectively disposed in the plurality of first sub-pixel areas of the first pixel column, and the plurality of first electronic units are electrically connected to the first test switch element.

11. The electronic device according to claim 1, wherein the electronic device further includes a test signal line electrically connected between the test switch element and the test pad.

12. The electronic device according to claim 1, wherein the electronic unit is a light emitting unit.

13. The electronic device according to claim 2, wherein the plurality of test switch elements further include a fifth test switch element, the plurality of pixel areas further include a third pixel column extending along the first direction, and the fifth test switch element is disposed in the third pixel column.

14. The electronic device according to claim 13, wherein the plurality of pixel areas include a first pixel row, a second pixel row and a third pixel row extending along a second direction, the first direction is different from the second direction, the first test switch element is disposed in the first pixel row, the second test switch element is disposed in the second pixel row, and the fifth test switch element is disposed in the third pixel row.

15. The electronic device according to claim 13, wherein the plurality of pixel areas include a first pixel row extending along a second direction, the first direction is different from the second direction, and the first test switch element, the second test switch element and the fifth test switch element are disposed in the first pixel row.

16. The electronic device according to claim 1, wherein the electronic device further includes a bonding pad disposed on the second surface of the substrate, and the bonding pad is electrically connected to the data line.

17. The electronic device according to claim 1, wherein the test switch element includes a thin film transistor.

18. The electronic device according to claim 1, wherein the electronic device further includes a driving unit disposed on the substrate, and the driving unit is electrically connected between the electronic unit and the control unit.

19. The electronic device according to claim 1, wherein the electronic device further includes an electrostatic discharge element disposed on the first surface of the substrate, wherein the electrostatic discharge element is disposed at an edge of the active area.

20. The electronic device according to claim 19, wherein the electronic device further includes a test signal line, and the electrostatic discharge element is electrically connected to the test signal line and the data line.

\* \* \* \* \*